(12) United States Patent
Gao

(10) Patent No.: US 9,326,400 B2
(45) Date of Patent: Apr. 26, 2016

(54) BRACKET APPARATUS APPLICABLE TO KEYBOARD AND KEYBOARD COMPRISING THE BRACKET APPARATUS

(71) Applicant: ANKER TECHNOLOGY CO., LIMITED, Kowloon (HK)

(72) Inventor: Tao Gao, Shenzhen (CN)

(73) Assignee: Anker Technology Co., Limited, Kowloon (HK)

( * ) Notice: Subject to any disclaimer, the term of this patent is extended or adjusted under 35 U.S.C. 154(b) by 44 days.

(21) Appl. No.: 14/281,178

(22) Filed: May 19, 2014

(65) Prior Publication Data

US 2015/0334858 A1    Nov. 19, 2015

(51) Int. Cl.
| | |
|---|---|
| A47B 97/04 | (2006.01) |
| H05K 5/02 | (2006.01) |
| E05D 3/02 | (2006.01) |
| E05F 1/10 | (2006.01) |
| E05D 11/10 | (2006.01) |
| G06F 1/16 | (2006.01) |

(52) U.S. Cl.
CPC ............... *H05K 5/0226* (2013.01); *E05D 3/02* (2013.01); *E05D 11/1014* (2013.01); *E05F 1/1025* (2013.01); *G06F 1/1662* (2013.01); *H05K 5/0234* (2013.01)

(58) Field of Classification Search
CPC .. H05K 5/0226; H05K 5/0234; E05F 1/1025; E05F 3/02; E05F 11/1014; G06F 1/1662
USPC .......................................................... 248/447
See application file for complete search history.

(56) References Cited

U.S. PATENT DOCUMENTS

| | | | | |
|---|---|---|---|---|
| 7,286,341 B1 * | 10/2007 | Chang | ................... | G06F 1/1618 |
| | | | | 312/223.2 |
| 2014/0139987 A1 * | 5/2014 | Onda | ........................ | G06F 1/16 |
| | | | | 361/679.02 |
| 2015/0205327 A1 * | 7/2015 | Daley, III | ................ | G06F 1/163 |
| | | | | 361/679.03 |

* cited by examiner

*Primary Examiner* — Mark Wendell
(74) *Attorney, Agent, or Firm* — Ladas & Parry LLP

(57) ABSTRACT

Disclosed are a bracket apparatus applicable to a keyboard, and a keyboard comprising the bracket apparatus. The bracket apparatus comprises a shell, wherein: a support plate is hinged to the shell through a hinge shaft, a releasably-connected support shaft being disposed between a free end of the support plate and the shell, a torsion spring being sleeved onto the hinge shaft, two ends of the torsion spring being respectively connected to the shell and the support plate; and the shell is further provided with a push switch with a built-in spring apparatus, a locking bump being disposed on the push switch, a locking mating bump mating with the locking bump being disposed on a side portion of the support plate. The bracket apparatus has the advantages of simple operations and convenient in use.

10 Claims, 2 Drawing Sheets

BRACKET APPARATUS APPLICABLE TO KEYBOARD AND KEYBOARD COMPRISING THE BRACKET APPARATUS

TECHNICAL FIELD

The present invention relates to application of electronic devices, and particularly to a bracket apparatus applicable to a keyboard and a keyboard comprising the bracket apparatus.

BACKGROUND

With the development of such electronic devices as tablet computers and smart phones, peripheral devices mating with such electronic devices grow more and more plentiful. A keyboard, as an input tool, is a type of commonly used electronic device.

For user's convenience during use of such a keyboard, the keyboard is generally provided with a bracket apparatus to place such an electronic device as tablet computer and smart phone. However, the bracket apparatus generally needs to be opened manually; or during bouncing of the bracket apparatus, such problems as inaccurate positioning and unsmooth positioning cause inconvenience to the use, thereby greatly affecting user experience.

SUMMARY

The present invention is directed to providing a bracket apparatus applicable to a keyboard and convenient in opening, and a keyboard comprising the bracket apparatus.

A bracket apparatus applicable to a keyboard is provided. The bracket apparatus comprises a shell, wherein: a support plate is hinged to the shell through a hinge shaft, a releasably-connected support shaft being disposed between a free end of the support plate and the shell, a torsion spring being sleeved onto the hinge shaft, two ends of the torsion spring being respectively connected to the shell and the support plate; and the shell is further provided with a push switch with a built-in spring apparatus, a locking bump being disposed on the push switch, a locking mating bump mating with the locking bump being disposed on a side portion of the support plate, and incline bonding surfaces mating with each other being disposed on both the locking bump and the locking mating bump.

As an improvement to the above technical solution, a bottom portion of the shell is provided with a switch accommodation slot; the push switch is accommodated in the switch accommodation slot, a switch through hole being disposed on a side wall of the switch accommodation slot; one end of the push switch passes through the switch through hole and extends outside the shell, a spring groove being disposed on another side wall of the switch accommodation slot; and a side of the push switch close to a spring groove is provided with a spring mating groove, a compression spring being disposed in the spring groove and the spring mating groove, one end of the compression spring being accommodated in the spring groove, and the other end of the compression spring being accommodated in the spring mating groove.

As a further improvement to the above technical solution, the push switch is provided with a screw press vacancy-avoiding hole, a limit screw fixed to the shell being disposed in the screw press vacancy-avoiding hole.

As a further improvement to the above technical solution, the bottom portion of the shell is provided with a switch press block; the switch press block limits the push switch in the switch accommodation slot; and the limit screw fixes the switch press block to the bottom portion of the shell.

As a further improvement to the above technical solution, an upper surface of the shell is provided with a support plate retraction vacancy-avoiding position operable to accommodating the support plate, a shaft installation hole being each disposed on a side wall of the support plate retraction vacancy-avoiding position and one end of the support plate; the hinge shaft passes through the shaft installation holes of the shell and the support plate and hinges the support plate onto the shell; the support plate is further provided with a torsion spring assembly hole; and the torsion spring is accommodated in the torsion spring assembly hole.

As a further improvement to the above technical solution, a lower side of the support plate is provided with support shaft holes; the support plate retraction vacancy-avoiding position is provided with two through grooves; and two ends of the support shaft pass through the through grooves, such that two end portions of the support shaft are installed in the support shaft holes.

As a further improvement to the above technical solution, the free end of the support plate is provided with a silicon bonding position, the silicon bonding position being provided with a silicon pad.

A keyboard is further provided. The above-described bracket apparatus is installed on the keyboard.

The present invention provides a bracket apparatus applicable to a keyboard and a keyboard comprising the bracket apparatus. When an electronic device is pressed against the push switch, the support plate is bounced to support the electronic device; when the support plate needs to be retracted, the support plate is pushed down to reach a locking position. The operation is simple. In one aspect, user experience is improved; and in another aspect, keyboard scuffing is prevented, achieving high practicability.

BRIEF DESCRIPTION OF THE DRAWINGS

The present invention is further described with reference to the accompanying drawings and exemplary embodiments.

DETAILED DESCRIPTION

Figure 1:
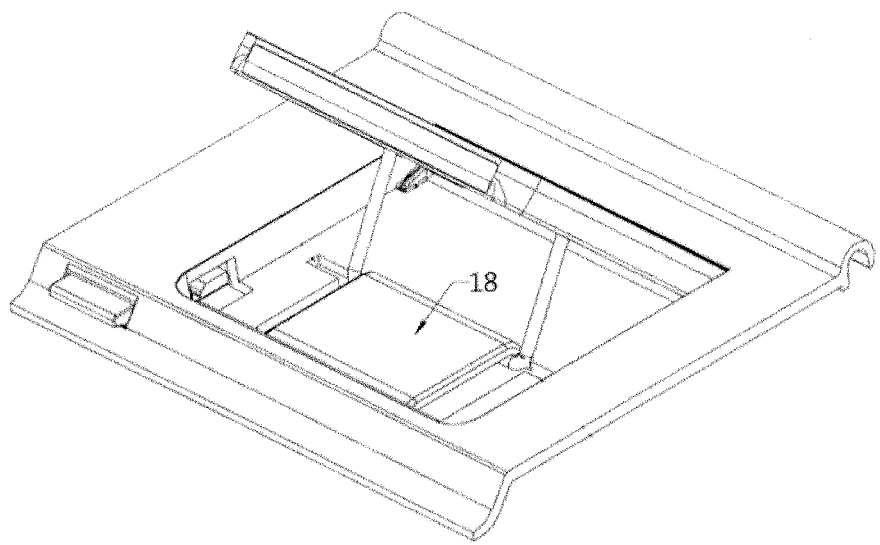
FIG. 1 is a schematic structural view of a bracket apparatus when a support table thereof is opened according to an embodiment of the present invention.
Figure 2:
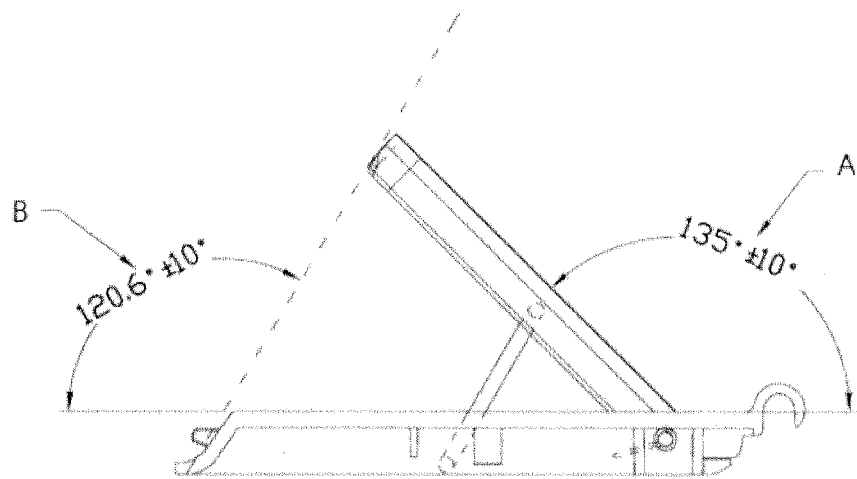
FIG. 2 is a schematic structural view of FIG. 1 taken from another perspective.
Figure 3:
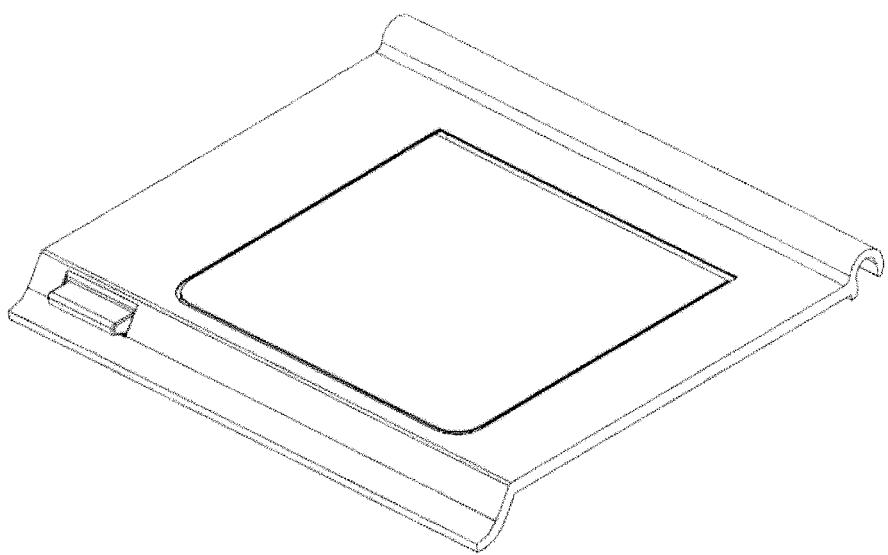
FIG. 3 is a schematic structural view of a bracket apparatus when a support plate thereof is closed according to an embodiment of the present invention.
Figure 4:
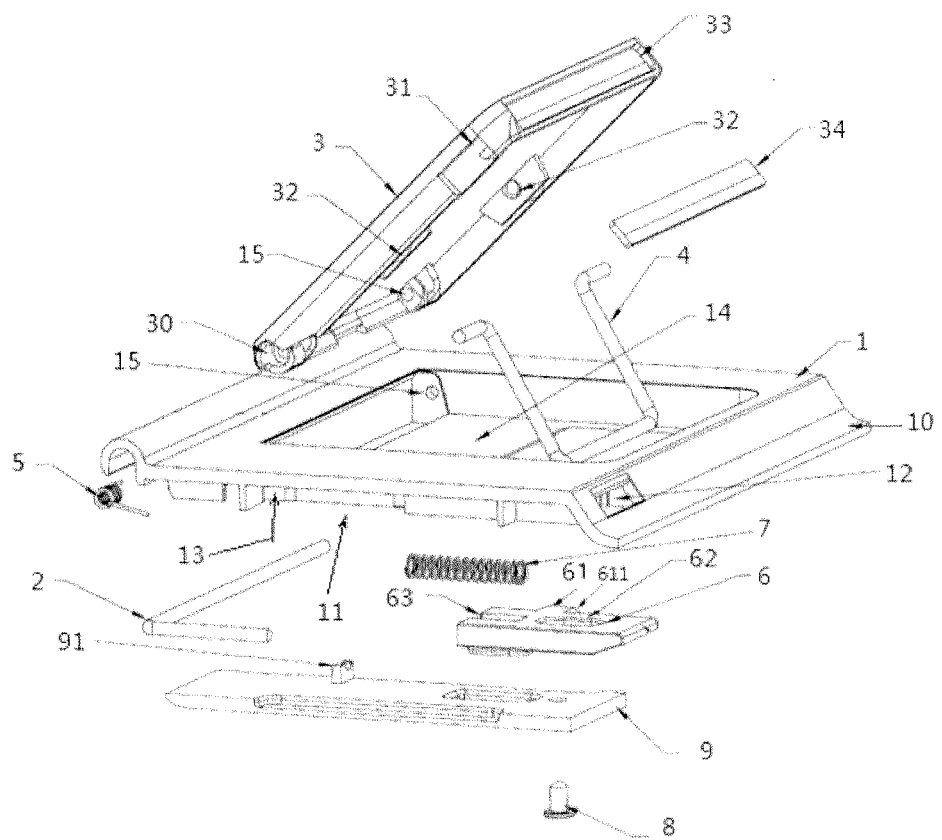
FIG. 4 is an exploded structural view of a bracket apparatus according to an embodiment of the present invention.

Referring to FIGS. 1 to 4, according to an embodiment of the present invention, a bracket apparatus applicable to a keyboard comprises a shell 1, wherein: a support plate 3 is hinged to the shell 1 through a hinge shaft 2, a releasably-connected support shaft 4, for example, a U-shaped support shaft 4, being disposed between a free end of the support plate 3 and the shell 1, a torsion spring 5 being sleeved onto the hinge shaft 2, two ends of the torsion spring 5 being respectively connected to the shell 1 and the support plate 3; and the shell 1 is further provided with a push switch 6 with a built-in spring apparatus, a locking bump 61 being disposed on the push switch 6, a locking mating bump 31 mating with the locking bump 61 being disposed on a side portion of the support plate 3, incline bonding surfaces 311 mating with each other being disposed on both the locking bump 61 and the locking mating bump 31.

A bottom portion of the shell 1 is provided with a switch accommodation slot 11; the push switch 6 is accommodated in the switch accommodation slot 11, a switch through hole 12 being disposed on a side wall of the switch accommodation slot 11; one end of the push switch 6 passes through the switch through hole 12 and extends outside the shell 1, a spring groove 13 being disposed on another side wall of the switch accommodation slot 11; and a side of the push switch 6 close to a spring groove 13 is provided with a spring mating groove 63, a compression spring 7 being disposed in the spring groove 13 and the spring mating groove 63, one end of the compression spring 7 being accommodated in the spring groove 13, and the other end of the compression spring 7 being accommodated in the spring mating groove 63.

The push switch 6 is provided with a screw press vacancy-avoiding hole 62, a limit screw 8 fixed to the shell 1 being disposed in the screw press vacancy-avoiding hole 62. The screw press vacancy-avoiding hole 62 may be a kidney hole, a shape with the widths at two ends of the hole being wider than the width in the middle of the hole.

The bottom portion of the shell 1 is provided with a switch press block 9; the switch press block 9 limits the push switch 6 in the switch accommodation slot 11; and the limit screw 8 fixes the switch press block 9 to the bottom portion of the shell 1.

The shell 1 may be further provided with an electronic device accommodation channel 10; the switch through hole 12 is disposed on a side wall of the electronic device accommodation channel 10; and one end of the push switch 6 passes through the switch through hole 12 and extends outside the shell 1.

An upper surface of the shell 1 is provided with a support plate retraction vacancy-avoiding position 14 operable to accommodating the support plate 3, a shaft installation hole 15 being each disposed on a side wall of the support plate retraction vacancy-avoiding position 14 and one end of the support plate 3; the hinge shaft 2 passes through the shaft installation holes 15 of the shell 1 and the support plate 3 and hinges the support plate 3 onto the shell 1; and the support plate 3 is further provided with a torsion spring assembly hole 30; and the torsion spring 5 is accommodated in the torsion spring assembly hole 30.

The switch press block 9 may be provided with a hinge shaft positioning mechanism 91, the hinge shaft positioning mechanism 91 being provided with a groove 911; and the hinge shaft 2 is L-shaped, one end of the hinge shaft 2 being fixed to the hinge shaft positioning mechanism 91, and the other end of the hinge shaft passing through a shaft installation hole 15. In this way, the hinge shaft 2 will neither rotate as the support plate 3 rotates, nor axially move in the shaft installation hole 15, such that the hinge mechanism is more stable.

A lower side of the support plate 3 is provided with U-shaped support shaft holes 32; the support plate retraction vacancy-avoiding position 14 is provided with two through grooves 16; the support plate retraction vacancy-avoiding position 14 is further provided with a sliding limiting mechanism 18, the through grooves 16 being disposed on two ends of a lower portion of the sliding limiting mechanism 18; and the support shaft 4 passes through the through grooves 16 and is slidably disposed in the sliding limiting mechanism 18, such that end portions of the support shaft 4 are installed in the support shaft holes 32.

The free end of the support plate 3 is provided with a silicon bonding position, the silicon bonding position being provided with a silicon pad. The silicon pad effectively improves the friction between the supporting plate 3 and a supported electronic device, which prevents the electronic device from sliding.

During the use of the bracket apparatus, in an initial state, the locking mating bump 31 on the support plate 3 and the locking bump 61 on the push switch 6 are interlocked, and the entire support plate 3 is in the support plate retraction vacancy-avoiding position 14. In this case, the part of the push switch 6 extending outside the shell 1 is pressed with a great force; suffering the force, the push switch 6 compresses the compression spring 7; and when the compression spring 7 is compressed to a predetermined position, the locking mating bump 31 on the support plate 3 and the locking bump 61 on the push switch 6 are released from the interlocking, the support plate 3 is bounced under a torsion force of the torsion spring 5, and the bounced support plate 3 supports the electronic device. The above pressure is from the electronic device placed on the shell 1. To be specific, when the electronic device is pressed against a portion extending outside the shell 1 of the push switch 6, as mentioned above, the support plate 3 is bounced to support the electronic device. An included angle A formed between the support plate 3 and the shell 1 is 135°±10°. However, an included angle B formed between a plane formed by the electronic device accommodation channel and the free end of the support plate 3 and the shell 1 is 120.6°±10°. To be specific, the relative position between the electronic device accommodating groove and the free end of the support plate 3 ensures that the front of the supported electronic device and the support face of the support plate form a blunt angle of 120.6°±10°.

When the support plate 3 needs to be retracted, a user pushes down the support plate 3, and when the support plate 3 reaches a predetermined position, the incline bonding surface 611 disposed on the locking mating bump 31 is pressed towards the incline bonding surface 611 disposed on the locking bump 61, and in this case the push switch 6 is pressed towards the compression spring 7. When the compression spring 7 is compressed to a predetermined position, interlocking of the locking mating bump 31 and the locking bump 61 is implemented, such that the entire support plate 3 is accommodated in the support plate retraction vacancy-avoiding position 14. The included angle formed between the shell 1 and the bounced support plate 3 is 45°±10°. This angle is more convenient for pushing down the support plate.

Based on the above bracket apparatus, the present invention further provides a keyboard, wherein the bracket apparatus is installed on the keyboard.

Described above are exemplary embodiments of the present invention. However, the present invention is not limited thereto. A person skilled in the art may make various equivalent variations or replacements without departing from the spirit of the present invention. Such equivalent variations or replacements shall fall within the scope defined by the claims of the present invention.

What is claimed is:

1. A bracket apparatus applicable to a keyboard, comprising a shell (1), wherein: a support plate (3) is hinged to the shell (1) through a hinge shaft (2), a releasably-connected support shaft (4) being disposed between a free end of the support plate (3) and the shell (1), a torsion spring (5) being sleeved onto the hinge shaft (2), two ends of the torsion spring (5) being respectively connected to the shell (1) and the support plate (3); and the shell (1) is further provided with a push switch (6) with a built-in spring apparatus, a locking bump

(61) being disposed on the push switch (6), a locking mating bump (31) mating with the locking bump (61) being disposed on a side portion of the support plate (3), and incline bonding surfaces (611) mating with each other being disposed on both the locking bump (61) and the locking mating bump (31), wherein: a bottom portion of the shell (1) is provided with a switch accommodation slot (11); the push switch (6) is accommodated in the switch accommodation slot (11), a switch through hole (12) being disposed on a side wall of the switch accommodation slot (11); one end of the push switch (6) passes through the switch through hole (12) and extends outside the shell (1), a spring groove (13) being disposed on another side wall of the switch accommodation slot (11); and a side of the push switch (6) close to the spring groove (13) is provided with a spring mating groove (63), a compression spring (7) being disposed in the spring groove (13) and the spring mating groove (63), one end of the compression spring (7) being accommodated in the spring groove (13), and the other end of the compression spring (7) being accommodated in the spring mating groove (63); and the push switch (6) is provided with a screw-press vacancy-avoiding hole (62), a limit screw (8) fixed to the shell (1) being disposed in the screw press vacancy-avoiding hole (62).

2. The bracket apparatus according to claim 1, wherein: the bottom portion of the shell (1) is provided with a switch press block (9); the switch press block (9) limits the push switch (6) in the switch accommodation slot (11); and the limit screw (8) fixes the switch press block (9) to the bottom portion of the shell (1).

3. The bracket apparatus according to claim 2, wherein: the switch press block (9) is further provided with a hinge shaft positioning mechanism (91); one end of the support plate (3) is provided with a shaft installation hole (15); one end of the hinge shaft (2) is fixed to the hinge shaft positioning mechanism (91); and the other end of the hinge shaft (2) passes through the shaft installation hole (15).

4. The bracket apparatus according to claim 2, wherein: an upper surface of the shell (1) is provided with a support plate retraction vacancy-avoiding position (14) operable to accommodating the support plate (3), a shaft installation hole (15) being each disposed on a side wall of the support plate retraction vacancy-avoiding position (14) and one end of the support plate (3); the hinge shaft (2) passes through the shaft installation holes (15) of the shell (1) and the support plate (3) and hinges the support plate (3) onto the shell (1); the support plate (3) is further provided with a torsion spring assembly hole (30); and the torsion spring (5) is accommodated in the torsion spring assembly hole (30).

5. The bracket apparatus according to claim 4, wherein: a lower side of the support plate (3) is provided with support shaft holes (32); the support plate retraction vacancy-avoiding position (14) is provided with a through groove (16) and a sliding limiting mechanism (18), the through groove (16) being disposed on two ends of a lower portion of the sliding limiting mechanism (18); and the support shaft (4) passes through the through grooves (16), such that two end portions of the support shaft (4) are installed in the support shaft holes (32).

6. The bracket apparatus according to claim 4, wherein: a lower side of the support plate (3) is provided with support shaft holes (32); the support plate retraction vacancy-avoiding position (14) is provided with two through grooves (16); the support plate retraction vacancy-avoiding position (14) is further provided with a sliding limiting mechanism (18), the through grooves (16) being disposed on two ends of a lower portion of the sliding limiting mechanism (18); and the support shaft (4) passes through the through grooves (16) and is slidably disposed in the sliding limiting mechanism (18), such that two end portions of the support shaft (4) are installed in the support shaft holes (32).

7. The bracket apparatus according to claim 5, wherein: the free end of the support plate (3) is provided with a silicon bonding position (33), the silicon bonding position (33) being provided with a silicon pad (34).

8. A keyboard, comprising a bracket apparatus, the bracket apparatus comprising a shell (1), wherein: a support plate (3) is hinged to the shell (1) through a hinge shaft (2), a releasably-connected support shaft (4) being disposed between a free end of the support plate (3) and the shell (1), a torsion spring (5) being sleeved onto the hinge shaft (2), two ends of the torsion spring (5) being respectively connected to the shell (1) and the support plate (3); and the shell (1) is further provided with a push switch (6) with a built-in spring apparatus, a locking bump (61) being disposed on the push switch (6), a locking mating bump (31) mating with the locking bump (61) being disposed on a side portion of the support plate (3), and incline bonding surfaces (611) mating with each other being disposed on both the locking bump (61) and the locking mating bump (31), wherein: a bottom portion of the shell (11) is provided with a switch accommodation slot (11); the push switch (6) is accommodated in the switch accommodation slot (11), a switch through hole (12) being disposed on a side wall of the switch accommodation slot (11); one end of the push switch (6) passes through the switch through hole (12) and extends outside the shell (1), a spring groove (13) being disposed on another side wall of the switch accommodation slot (11); and a side of the push switch (6) close to the spring groove (13) is provided with a spring mating groove (63), a compression spring (7) being disposed in the spring groove (13) and the spring mating groove (63), one end of the compression spring (7) being accommodated in the spring groove (13), and the other end of the compression spring (7) being accommodated in the spring mating groove (63) and the push switch (6) is provided with a screw press air-preventing hole (62), a limit screw (8) fixed on the shell (1) being disposed in the screw press air-preventing hole (62).

9. The keyboard according to claim 8, wherein: the bottom portion of the shell (1) is provided with a switch press block (9); the switch press block (9) limits the push switch (6) in the switch accommodation slot (11); and the limit screw (8) fixes the switch press block (9) to the bottom portion of the shell (1).

10. The keyboard according to claim 9, wherein: the switch press block (9) is further provided with a hinge shaft positioning mechanism (91); one end of the support plate (3) is provided with a shaft installation hole (15); one end of the hinge shaft (2) is fixed to the hinge shaft positioning mechanism (91); and the other end of the hinge shaft (2) passes through the shaft installation hole (15).

\* \* \* \* \*